US009230840B2

(12) United States Patent
Hiroki

(10) Patent No.: US 9,230,840 B2
(45) Date of Patent: Jan. 5, 2016

(54) SUBSTRATE TRANSFER DEVICE FOR SUBSTRATE PROCESSING SYSTEM

(71) Applicant: TOKYO ELECTRON LIMITED, Tokyo (JP)

(72) Inventor: Tsutomu Hiroki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/351,044

(22) PCT Filed: Oct. 2, 2012

(86) PCT No.: PCT/JP2012/075533
§ 371 (c)(1),
(2) Date: Apr. 10, 2014

(87) PCT Pub. No.: WO2013/054698
PCT Pub. Date: Apr. 18, 2013

(65) Prior Publication Data
US 2014/0271052 A1    Sep. 18, 2014

(30) Foreign Application Priority Data

Oct. 12, 2011    (JP) ................................ 2011-224996

(51) Int. Cl.
*G01B 11/14*    (2006.01)
*H01L 21/677*    (2006.01)
(Continued)

(52) U.S. Cl.
CPC .... *H01L 21/67703* (2013.01); *H01L 21/67196* (2013.01); *H01L 21/67259* (2013.01); *H01L 21/67742* (2013.01); *H01L 21/681* (2013.01)

(58) Field of Classification Search
CPC ................. G01N 15/0612; G01N 2015/0065; G01N 15/0656; G01N 2015/0046; G01N 2021/8488; G01N 2035/00356; G01N 2035/00772; G01N 2035/00811; G01N 2035/00851; G01N 21/15; G01N 21/25; G01N 21/55; G01N 21/06
See application file for complete search history.

(56) References Cited

U.S. PATENT DOCUMENTS 3,628,028 A * 12/1971 Thorsheim ..................... 250/576
5,306,209 A *  4/1994 Lang ............................. 454/192
(Continued)

FOREIGN PATENT DOCUMENTS

JP           6-100164 A     4/1994
JP        2001-126977 A     5/2001
(Continued)

OTHER PUBLICATIONS

International Search Report cited in Japanese Application No. PCT/JP2012/075533 dated Dec. 12, 2012.

*Primary Examiner* — Michael P Stafira
(74) *Attorney, Agent, or Firm* — Nath, Goldberg & Meyer; Jerald L. Meyer

(57) ABSTRACT

In one embodiment, a substrate transfer device is equipped with a chamber wall, a table, a linear motor transfer mechanism, an optical window, and a laser measuring instrument. The chamber wall defines a transfer space. The table is housed within the transfer space. It is possible for a substrate to be loaded on the table. The linear motor transfer mechanism moves the table within the transfer space, by a linear motor. The optical window is installed between the transfer space and the space to the outside of the transfer space. For example, the optical window is disposed so as to seal off an opening defined in the chamber wall. The laser measuring instrument irradiates a laser light through the optical window and towards the table, receives reflected light from the table, and measures the position of the table.

6 Claims, 10 Drawing Sheets

(51) Int. Cl.
  *H01L 21/67* (2006.01)
  *H01L 21/68* (2006.01)

(56) References Cited

U.S. PATENT DOCUMENTS

2001/0028456 A1* 10/2001 Nishi .............................. 356/400
2008/0144042 A1* 6/2008 Tanaka ......................... 356/498
2010/0237261 A1* 9/2010 Nishiyama ................. 250/492.3
2013/0334111 A1* 12/2013 Adam ............................. 210/85

FOREIGN PATENT DOCUMENTS

| JP | 2004-274889 A | 9/2004 |
| JP | 2010-040946 A | 2/2010 |
| JP | 2010-070946 A | 4/2010 |

* cited by examiner

SUBSTRATE TRANSFER DEVICE FOR SUBSTRATE PROCESSING SYSTEM

CROSS-REFERENCE TO RELATED APPLICATION

This application is a 35 U.S.C. §371 National Phase Entry Application from PCT/JP2012/075533, filed on Oct. 2, 2012, which claims the benefit of Japanese Patent Application No. 2011-224996, filed on Oct. 12, 2011, in the Japan Patent Office, the disclosure of which is incorporated herein in their entirety by reference.

TECHNICAL FIELD

Embodiments of the present disclosure relate to a substrate transfer device for a substrate processing system.

BACKGROUND

A substrate transfer device for a processing system for processing a substrate such as a semiconductor substrate or the like is provided with a chamber, a table and a transfer mechanism. The table is housed within the chamber and is moved within the chamber by the transfer mechanism of a linear motor.

The substrate transfer device is provided with a linear scale and a sensor in order to measure the position of the table. The sensor is installed in the table. The sensor reads the current position of the table from the linear scale and outputs a signal indicative of the current position to the outside of the chamber. For that reason, a signal outputting cable extends from the sensor to the outside of the chamber.

SUMMARY

In the substrate transfer device, a portion of the cable exists within the chamber. This necessitates cable treatment such as wiring or the like within the chamber. The cable treatment may become more difficult as the moving distance of the table grows longer.

Accordingly, in the present technical field, a demand has existed for a substrate transfer device capable of solving the cable treatment problem.

A substrate transfer device according to one aspect of the present disclosure includes a chamber wall, a table, a linear motor transfer mechanism, an optical window and a laser measuring instrument. The chamber wall defines a transfer space. In one embodiment, the transfer space is a depressurizable transfer space. The table is accommodated within the transfer space. A substrate can be loaded onto the table. The linear motor transfer mechanism moves the table within the transfer space by the driving force of a linear motor. The optical window is installed between the transfer space and a space existing outside the transfer space. For example, the optical window is installed so as to seal off an opening defined in the chamber wall. The laser measuring instrument measures a position of the table by irradiating laser light toward the table through the optical window and receiving reflected light coming from the table.

In the substrate transfer device, it is possible to measure the position of the table by the laser measuring instrument. Thus, there is no need to treat a cable within the transfer space.

In one embodiment, the substrate transfer device may further include a pipe optically interconnecting the optical window and the transfer space. One end of the pipe may be coupled to the optical window and the other end of the pipe may be installed within the transfer space. The laser measuring instrument can irradiate laser light through the optical window and a bore of the pipe and can receive the reflected light through the pipe and the optical window. According to this embodiment, the pipe can reduce the conductance in a route between the transfer space and the optical window. As a result, it is possible to reduce the probability that gas molecules existing within the transfer space adhere to the optical window.

In one embodiment, at least a portion of an inner surface defining the bore of the pipe may have corrugations. The corrugations may be corrugation of 0.1 mm to 3 mm. In one embodiment, the inner surface of the pipe may be a porous surface. According to these embodiments, gas molecules can be captured by the inner surface of the pipe. As a result, it is possible to further restrain the gas molecules from adhering to the optical window.

In one embodiment, the bore of the pipe may include a portion having a first inner diameter and a portion having a second inner diameter smaller than the first inner diameter, which portions are arranged along a longitudinal direction of the pipe. According to this embodiment, the inner diameter of the bore can be reduced in a portion of the bore of the pipe, thereby further reducing the conductance in the portion. As a result, it is possible to further restrain the gas molecules from adhering to the optical window.

In one embodiment, the bore of the pipe may be defined along a zigzag route, and one or more optical mirrors optically interconnecting one end of the bore and the other end of the bore may be installed in the bore of the pipe. According to this embodiment, it is also possible to restrain the gas molecules from adhering to the optical window.

In one embodiment, the substrate transfer device may further include a gas supply path configured to supply an inert gas into the bore of the pipe. According to this embodiment, an inert gas is supplied to the bore. Thus, the gas molecules are restrained from flowing into the bore. As a result, it is possible to restrain the gas molecules from adhering to the optical window.

As described above, according to one aspect and various embodiments of the present disclosure, there is provided a substrate transfer device which makes it unnecessary to treat a signal cable for measuring the position of the table within the transfer space.

DETAILED DESCRIPTION

Various embodiments will now be described in detail with reference to the drawings. Throughout the drawings, identical or equivalent parts will be designated by same reference symbols.

Figure 1:
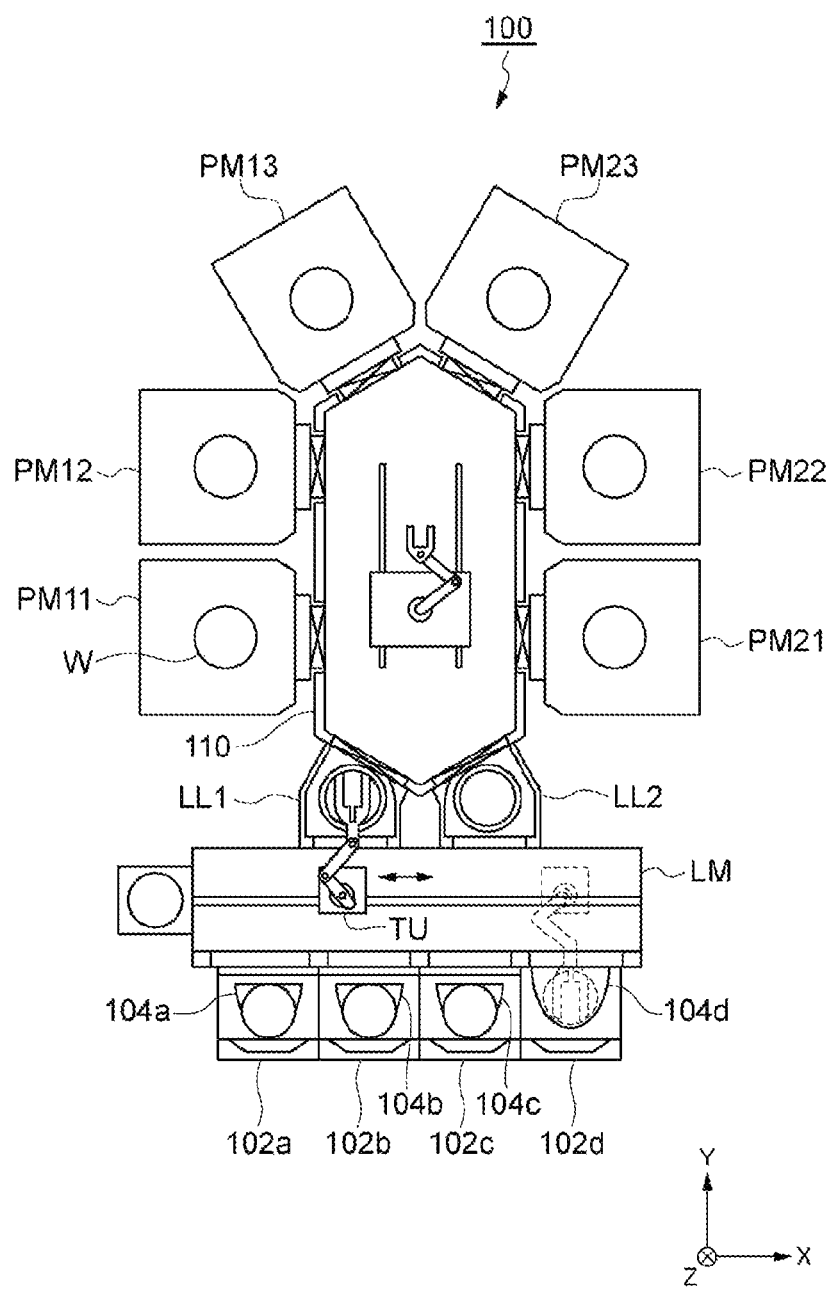
FIG. 1 is a plan view showing a processing system according to one embodiment.

FIG. 1 is a plan view showing a processing system according to one embodiment, in which view the processing system is seen from above in a typical state of use. In the following description, the substrate transferring direction of a substrate transfer device connected to a process module in the below-mentioned embodiment will be defined as a Y-direction. The height direction in a typical state of use of the processing system will be defined as a Z-direction. The direction intersecting or orthogonally intersecting the Z-direction and the Y-direction will be defined as an X-direction.

The processing system 100 shown in FIG. 1 is a system for processing a substrate W to be processed. The processing system 100 includes loading tables 102a to 102d, containers 104a to 104d, a loader module (an atmosphere substrate transfer device) LM, load lock chambers LL1 and LL2, process modules PM11, PM12, PM13, PM21, PM22 and PM23 and a transfer chamber (a vacuum substrate transfer device) 110. At least one of the process modules PM11, PM12, PM13, PM21, PM22 and PM23 is connected to the transfer chamber 110.

The loading tables 102a to 102d are disposed in the X-direction along one Y-direction edge portion of the loader module LM. The containers 104a to 104d are respectively loaded on the loading tables 102a to 102d. Substrates W are accommodated within the containers 104a to 104d.

The loader module LM is a substrate transfer device (an atmosphere substrate transfer device) configured to transfer a substrate in an atmospheric environment. In one embodiment thereof, the loader module LM has a substantially box-like shape longer in the X-direction than in the Y-direction. The loader module LM includes a chamber wall that defines therein a transfer space kept in an atmospheric pressure state. The loader module LM includes a transfer unit TU arranged in the transfer space. The transfer unit TU of the loader module LM takes a substrate W out of one of the containers 104a to 104d and transfers the taken-out substrate W to one of the load lock chambers LL1 and LL2. In one embodiment, the transfer unit TU of the loader module LM can move in the X-direction.

The load lock chambers LL1 and LL2 are arranged in the X-direction along the other Y-direction edge portion of the loader module LM. At the other Y-direction side of the loader module LM, there is installed a transfer chamber 110 extending in the Y-direction. As shown in FIG. 1, the load lock chambers LL1 and LL2 are installed between the loader module LM and the transfer chamber 110.

The load lock chambers LL1 and LL2 are used as preliminary decompression chambers within which the substrate W transferred from the loader module LM stays before they are moved to the transfer chamber 110 whose internal transfer space is kept in a decompressed or vacuum state. Openable/closable gate valves are installed between the load lock chamber LL1 and the loader module LM, between the load lock chamber LL1 and the transfer chamber 110, between the load lock chamber LL2 and the loader module LM, and between the load lock chamber LL2 and the transfer chamber 110.

The transfer chamber 110 is a substrate transfer device (a vacuum substrate transfer device) configured to transfer a substrate in a vacuum environment. In one embodiment thereof, the transfer chamber 110 moves a substrate W in the Y-direction within a depressurizable transfer space and transfers the substrate W to one of the process modules PM11, PM12, PM13, PM21, PM22 and PM23. Openable/closable gate valves are installed between the transfer chamber 110 and the process modules PM11, PM12, PM13, PM21, PM22 and PM23.

The process modules PM11, PM12 and PM13 are arranged in the Y-direction along one X-direction edge portion of the transfer chamber 110. The process modules PM21, PM22 and PM23 are arranged in the Y-direction along the other X-direction edge portion of the transfer chamber 110. The process modules PM11, PM12, PM13, PM21, PM22 and PM23 processes the substrates W accommodated therein. Examples of the processing performed by the process modules include etching, film forming, ashing, sputter film forming, chemical oxide removal, and so forth.

In the processing system 100 of the embodiment shown in FIG. 1, the substrate W accommodated within one of the containers 104a to 104d is transferred to one of the process modules PM11, PM12, PM13, PM21, PM22 and PM23 through the loader module LM, the load lock chamber LL1 or LL2 and the transfer chamber 110 and is processed in the process module as a transferring destination. The substrate W processed in the process module as a transferring destination is returned to the loader module LM through the transfer chamber 110 and the load lock chamber LL1 or LL2.

Figure 2:
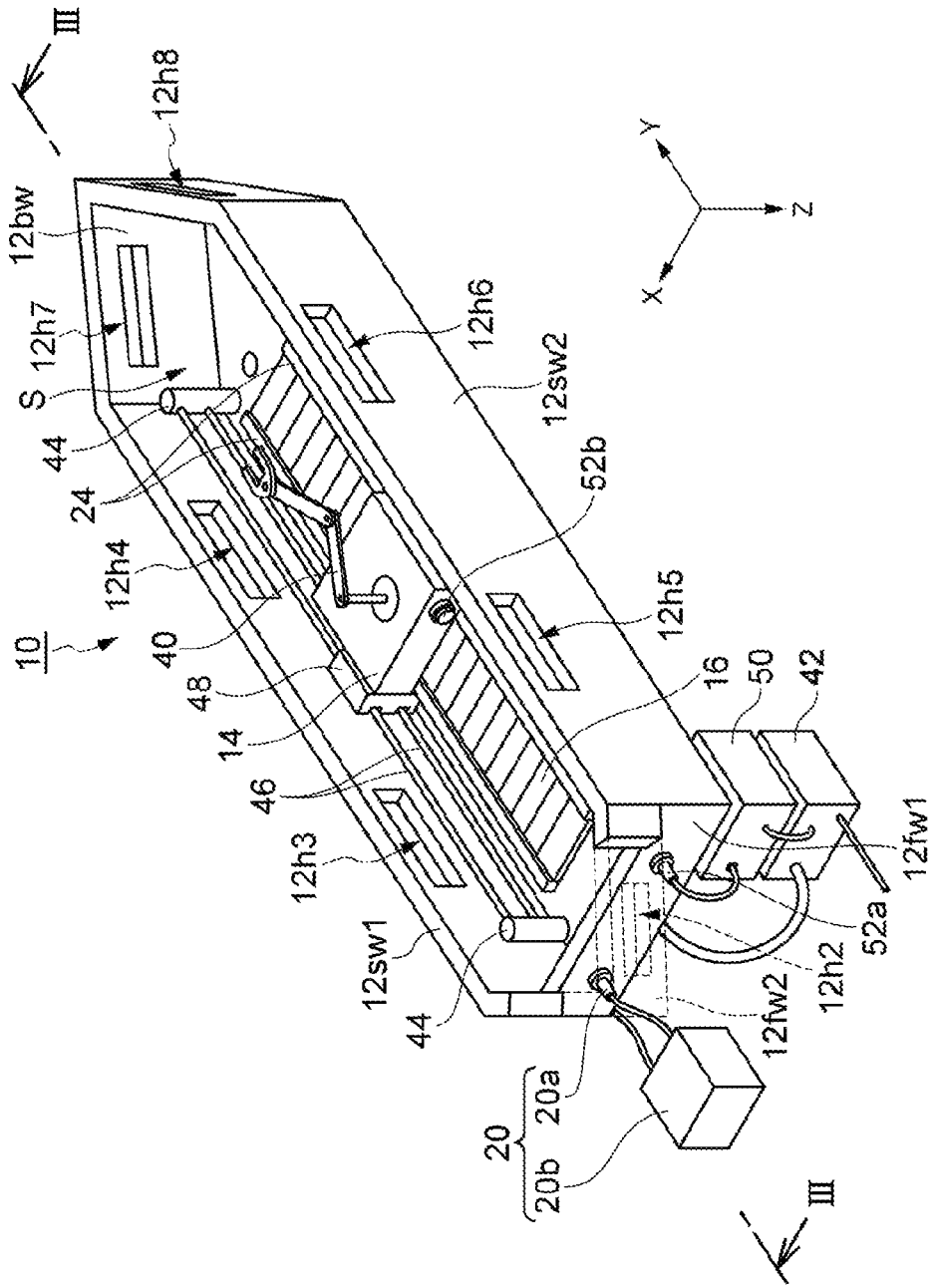
FIG. 2 is a perspective view of a substrate transfer device which can be employed in the processing system shown in FIG. 1, with an upper portion removed so as to show the interior thereof.
Figure 3:
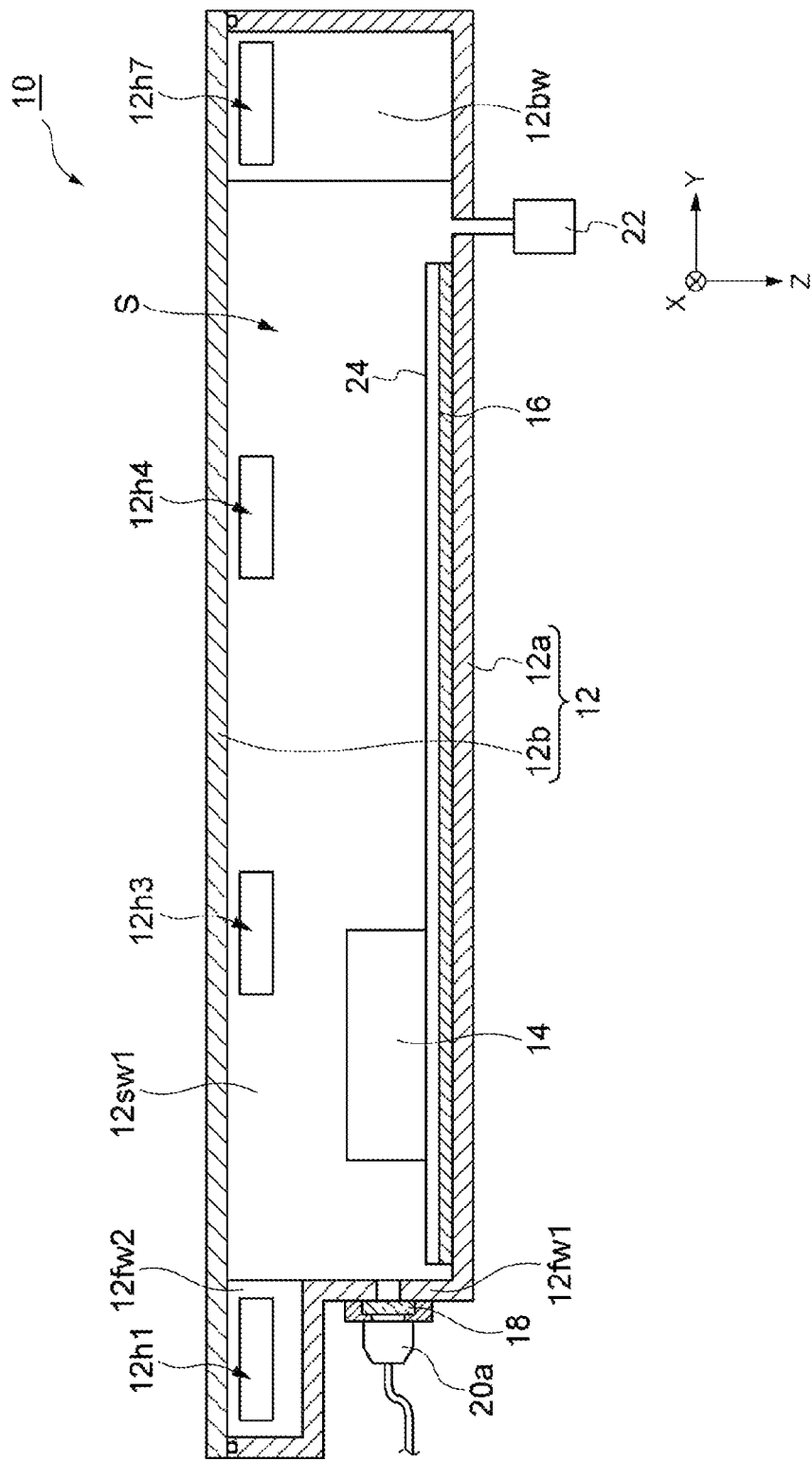
FIG. 3 is a sectional view taken along a line III-III in FIG. 2.
Figure 4:
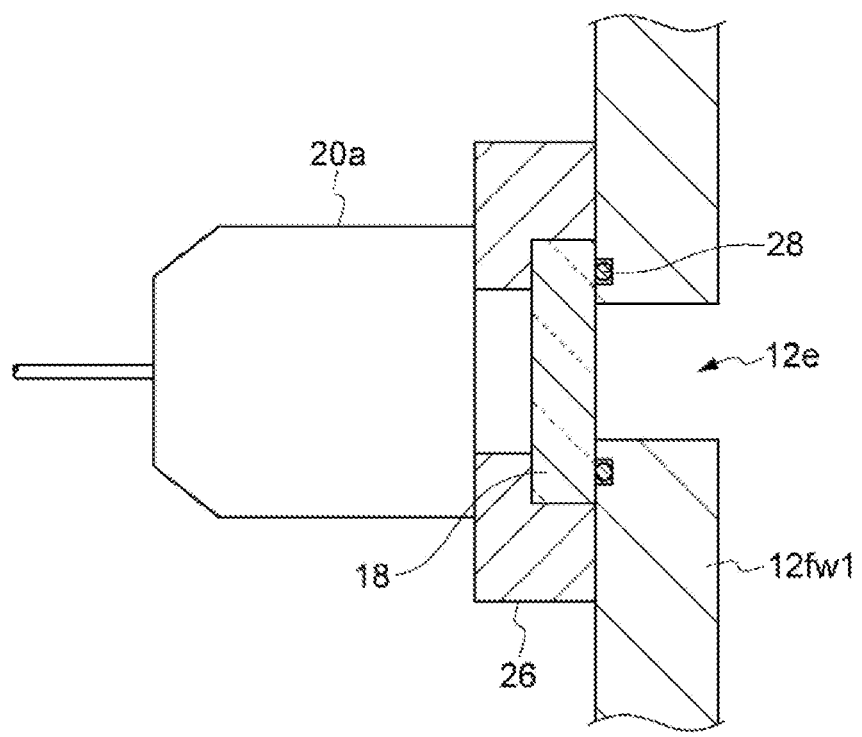
FIG. 4 is a partially enlarged sectional view of the substrate transfer device shown in FIG. 3, showing a laser measuring instrument.

Hereinafter, description will be given on a substrate transfer device according to one embodiment. FIG. 2 is a perspective view of a substrate transfer device according to one embodiment, with an upper portion removed for the illustration of the interior thereof. FIG. 3 is a sectional view taken along line III-III in FIG. 2. In FIG. 3, a current supply rod, a cable, a pickup, a transfer robot and an optical communication unit are omitted. FIG. 4 is a partially enlarged sectional view of the substrate transfer device shown in FIG. 3, showing a laser measuring instrument. The transfer chamber 10 shown in FIGS. 2 and 3 can be used as the transfer chamber 110 of the processing system 100. However, the transfer chamber 10 may be used as a transfer chamber of another processing system. Description will now be made with reference to FIGS. 2, 3 and 4.

The transfer chamber 10 includes a chamber wall 12, a table 14, a linear motor transfer mechanism 16, an optical window 18 and a laser measuring instrument 20. The chamber wall 12 has a substantially box-like shape elongated in the Y-direction. The chamber wall 12 defines a transfer space S therein. The transfer space S is a space that can be kept in a decompressed state or a vacuum state. Thus, an exhaust device 22 is connected to the transfer space S.

In one embodiment, the chamber wall 12 may include a body portion 12a and a top plate portion 12b. The body portion 12a defines the transfer space S from the Y-direction, the X-direction and the lower side. The top plate portion 12b, which is a flat plate-shaped member, defines the transfer space S from the upper side. A seal member such as an O-ring or the like may be installed between the top plate portion 12b and the top portion of the body portion 12a.

In one embodiment, the body portion 12a of the chamber wall 12 includes a front wall 12fw1 and a front wall 12fw2 installed at one Y-direction side of the transfer space S. The front wall 12fw1 is installed below the front wall 12fw2. The front wall 12*fw*2 is a wall having a V-like cross section. Openings 12*h*1 and 12*h*2 are formed in the front wall 12*fw*2. The opening 12*h*1 can be used as an opening through which to move the substrate W between the internal space of the load lock chamber LL1 and the transfer space S. Further, the opening 12*h*2 can be used as an opening through which to move the substrate W between the internal space of the load lock chamber LL2 and the transfer space S. Gate valves for opening and closing the openings 12*h*1 and 12*h*2 may be installed in the transfer chamber 10.

The body portion 12*a* of the chamber wall 12 includes a pair of sidewalls 12*sw*1 and 12*sw*2 extending in the Y-direction. Openings 12*h*3 and 12*h*4 are formed in the sidewall 12*sw*1. Further, openings 12*h*5 and 12*h*6 are formed in the sidewall 12*sw*2. The openings 12*h*3 and 12*h*4 can be respectively used as an opening through which to move the substrate W between the transfer space S and the process modules PM11 and as an opening through which to move the substrate W between the transfer space S and the process modules PM12. Further, the openings 12*h*5 and 12*h*6 can be respectively used as an opening through which to move the substrate W between the transfer space S and the process modules PM21 and as an opening through which to move the substrate W between the transfer space S and the process modules PM22. Gate valves for opening and closing the openings 12*h*3, 12*h*4, 12*h*5 and 12*h*6 may be installed in the transfer chamber 10.

The body portion 12*a* of the chamber wall 12 includes a rear wall 12*bw* installed at the other Y-direction side of the transfer space S. The rear wall 12*bw* is a wall having a V-like cross section. Openings 12*h*7 and 12*h*8 are formed in the rear wall 12*bw*. The opening 12*h*7 can be used as an opening through which to move the substrate W between the transfer space S and the process modules PM13. Likewise, the opening 12*h*8 can be used as an opening through which to move the substrate W between the transfer space S and the process modules PM23. Gate valves for opening and closing the openings 12*h*7 and 12*h*8 may be installed in the transfer chamber 10.

As shown in FIGS. 2 and 3, in one embodiment, a table 14 is housed within the transfer space S defined by the chamber wall 12. Furthermore, a pair of linear guides 24 extending in the Y-direction is installed within the transfer space S. The table 14 is driven by a transfer mechanism 16 and is moved in the Y-direction along the linear guides 24. The transfer mechanism 16 uses the drive power of a linear motor. The primary side of the linear motor is installed between the linear guides 24. The secondary side of the linear motor is attached to the table 14.

In one embodiment, a transfer robot 40 for holding and transferring the substrate W is installed on the table 14. The transfer robot 40 can take out the substrates W accommodated within the load lock chambers LL1 and LL2 through the openings 12*h*1 and 12*h*2. Moreover, the transfer robot 40 can transfer the substrates W to the process modules PM11, PM12, PM13, PM21, PM22 and PM23 through the openings 12*h*3 to 12*h*8. Thus, the transfer chamber 10 includes a mechanism for supplying a control signal and an electric current to the transfer robot 40.

In one embodiment, an electric current is supplied from an external power supply to the transfer robot 40 in a contactless current feeding method. More specifically, the transfer chamber 10 may further include a power supply 42, a pair of current feeding rods 44, a cable 46 and a pickup 48. The current feeding rods 44 are installed along the sidewall 12*sw*1. The cable 46 is wired in the Y-direction between the current feeding rods 44. The cable 46 is electrically connected to the power supply 42. The pickup 48 is attached to the table 14. The pickup 48 moves in the Y-direction along the cable 46 together with the table 14. An electric current fed from the power supply 42 is supplied to a wiring line wound around the pickup 48 through the cable 46 in a contactless manner and is then supplied from the wiring line to the transfer robot 40.

In one embodiment, the transfer chamber 10 may further include a robot controller 50 and optical communication units 52*a* and 52*b*. The robot controller 50 is connected to the power supply 42 and also to the optical communication unit 52*a*. The robot controller 50 generates an electric control signal to be transmitted to the transfer robot 40. The optical communication unit 52*a* is attached to the body portion 12*a* and the front wall 12*fw*1 and is configured to emit an optical control signal into the transfer space S through an optical window installed in the front wall 12*fw*1. The optical control signal is generated by the optical communication unit 52*a* based on the aforementioned electric control signal.

The optical communication unit 52*b* is attached to the table 14. The optical communication unit 52*b* receives the optical control signal generated by the optical communication unit 52*a*. The transfer chamber 10 generates an electric control signal for the control of the transfer robot 40 based on the optical control signal received by the optical communication unit 52*b*.

In this way, the transfer chamber 10 can control the transfer robot 40 by the optical communication using the optical communication units 52*a* and 52*b*. Accordingly, there is no need to install, within the transfer space S, a cable for supplying a control signal to the transfer robot 40. Moreover, the cable 46 that supplies an electric current for driving the transfer robot 40 is configured to supply an electric current to the transfer robot 40 in a contactless current feeding method. That is to say, the power cable is not connected to the moving bodies such as the table 14, the pickup 48 and the transfer robot 40. Therefore, the transfer chamber 10 is configured to facilitate the wiring of the power cable within the transfer space S.

Hereinafter, reference is made to FIG. 4. As shown in FIG. 4, in one embodiment, an opening 12*e* is formed in the front wall 12*fw*1. The opening 12*e* is closed by an optical window 18. More specifically, the optical window 18 is installed in an external space existing at the opposite side of the front wall 12*fw*1 from the transfer space S. A seal member 28 such as an O-ring or the like is installed between the optical window 18 and the outer surface of the front wall 12*fw*1. Thus, the opening 12*e* is kept closed and the transfer space S is hermetically sealed.

The optical window 18 is gripped between the outer surface of the front wall 12*fw*1 and a flange 26. An opening is formed in the flange 26 so as to be aligned with the opening 12*e* in the Y-direction. The flange 26 may be screw-fixed or welded to the body portion 12*a*.

An optical unit 20*a* of the laser measuring instrument 20 is optically coupled with the optical window 18. The optical window 18 is transparent to the laser light emitted from the optical unit 20*a* and the reflected light generated when the laser light is reflected by the table 14. The optical window 18 is made of, e.g., optical glass.

The laser measuring instrument 20 is installed outside the transfer space S. The optical unit 20*a* of the laser measuring instrument 20 irradiates laser light in the Y-direction through the optical window 18. The laser light coming from the optical unit 20*a* is reflected by the table 14. The optical unit 20*a* receives the reflected light coming from the table 14 and outputs an electric signal at a timing conforming to the reception timing of the reflected light. For that purpose, the optical unit 20a may include, e.g., a laser light generator such as a semiconductor laser or the like and a laser light receiver such as a photodiode or the like.

The laser measuring instrument 20 further includes a control unit 20b (see FIG. 2) electrically connected to the optical unit 20a. The control unit 20b controls the generation of laser light from the optical unit 20a and the irradiation timing of the laser light. Moreover, the control unit 20b receives the aforementioned electric signal from the light receiver of the optical unit 20a. The control unit 20b can measure the current position of the table 14 based on the time difference between the irradiation timing of the laser light and the output timing of the aforementioned electric signal. In addition, the control unit 20b can control the position of the table 14 by supplying a signal to the transfer mechanism 16 depending on the current position of the table 14 measured as above.

According to the transfer chamber 10 described above, the position of the table 14 can be measured through the use of the laser measuring instrument 20. Accordingly, there is no need to install, within the transfer space S, an electric signal cable used in measuring the position of the table 14.

Figure 5:
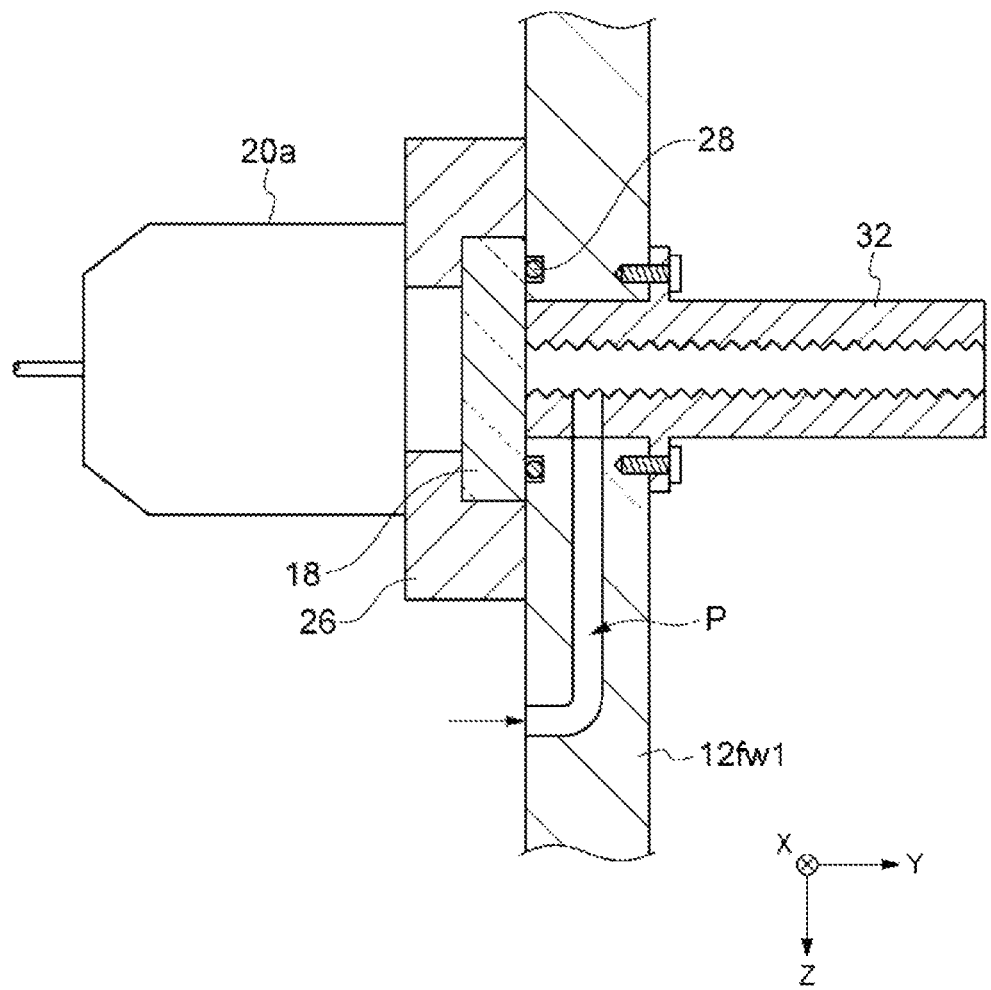
FIG. 5 is an enlarged sectional view of a laser measuring instrument according to another embodiment.

Hereinafter, description will be made on another embodiment. FIG. 5 is an enlarged sectional view of a laser measuring instrument according to another embodiment. As shown in FIG. 5, the transfer chamber 10 may further include a pipe 32. The pipe 32 may be made of austenitic stainless steel or aluminum with a surface processed with alumite.

The pipe 32 extends in the Y-direction. One end portion of the pipe 32 is coupled with the optical window 18. The other end of the pipe 32 is positioned within the transfer space S. A flange portion is installed on the outer circumferential surface of the pipe 32. One end portion of the pipe 32, namely the portion of the pipe 32 extending from the flange portion toward the optical window 18, is inserted into the opening of the front wall 12fw1 (the opening leading to the optical window 18). The flange portion is fixed to the body portion 12a by screws. In one embodiment, as shown in FIG. 5, the optical window 18 communicates with the interior of the transfer space S only through the bore of the pipe 32. The pipe 32 may have an inner diameter of, e.g., 2 to 3 mm.

In this embodiment, the laser light irradiated from the optical unit 20a and the reflected light coming from the table 14 are guided through the bore of the pipe 32. Since the conductance of the bore of the pipe 32 is low, it is possible to reduce the probability that gas molecules existing within the transfer space S adhere to the optical window 18. The gas molecules existing within the transfer space S may be generated from the substrate W to which the molecules of a gas used in the processing of the substrate W such as etching or depositing adhere.

In one embodiment, as shown in FIG. 5, the inner surface of the pipe 32 defining the bore may have corrugations in at least a portion thereof extending in the Y-direction. The depth of the corrugations may be from 0.1 to 3 mm. If the pipe 32 has an inner surface with corrugations (a corrugated surface) as mentioned above, the inner diameter of the pipe can be defined by a numerical value twice as large as the radial distance between the central axis of the bore of the pipe and the point on the inner surface of the pipe closest to the central axis. The depth of corrugations can be defined by a difference between the radial distance between the central axis of the bore of the pipe and the point on the corrugated surface of the pipe closest to the central axis and the radial distance between the central axis and an arbitrary point on the corrugated surface. The corrugations formed on the inner surface of the pipe 32 in this manner can capture the gas molecules introduced from the interior of the transfer space S into the bore of the pipe 32. As a result, it is possible to further restrain the gas molecules from adhering to the optical window 18.

In another embodiment, the inner surface of the pipe 32 defining the bore thereof may be a porous surface. The porous surface can capture the gas molecules introduced from the interior of the transfer space S into the bore of the pipe 32. This makes it possible to further restrain the gas molecules from adhering to the optical window 18.

As shown in FIG. 5, in one embodiment, an inert gas such as argon or the like may be supplied into the bore of the pipe 32. For that purpose, a gas supply path P extending from the bore of the pipe 32 to the outer surface of the body portion 12a may be formed over the pipe 32 and the body portion 12a. An inert gas supply source is connected to the gas supply path P. An inert gas is supplied into the gas supply path P so as to flow from the opening of the outer surface of the body portion 12a toward the bore of the pipe 32. This makes it possible to restrain the gas molecules existing within the transfer space S from flowing into the bore of the pipe 32.

The gas supply path P may be connected to the bore of the pipe 32 in a position closer to the end of the pipe 32 existing at the side of the optical window 18 than to the end of the pipe 32 existing at the side of the transfer space S. With this configuration, it is possible to further restrain the gas molecules existing within the transfer space S from flowing into the bore of the pipe 32.

Figure 6:
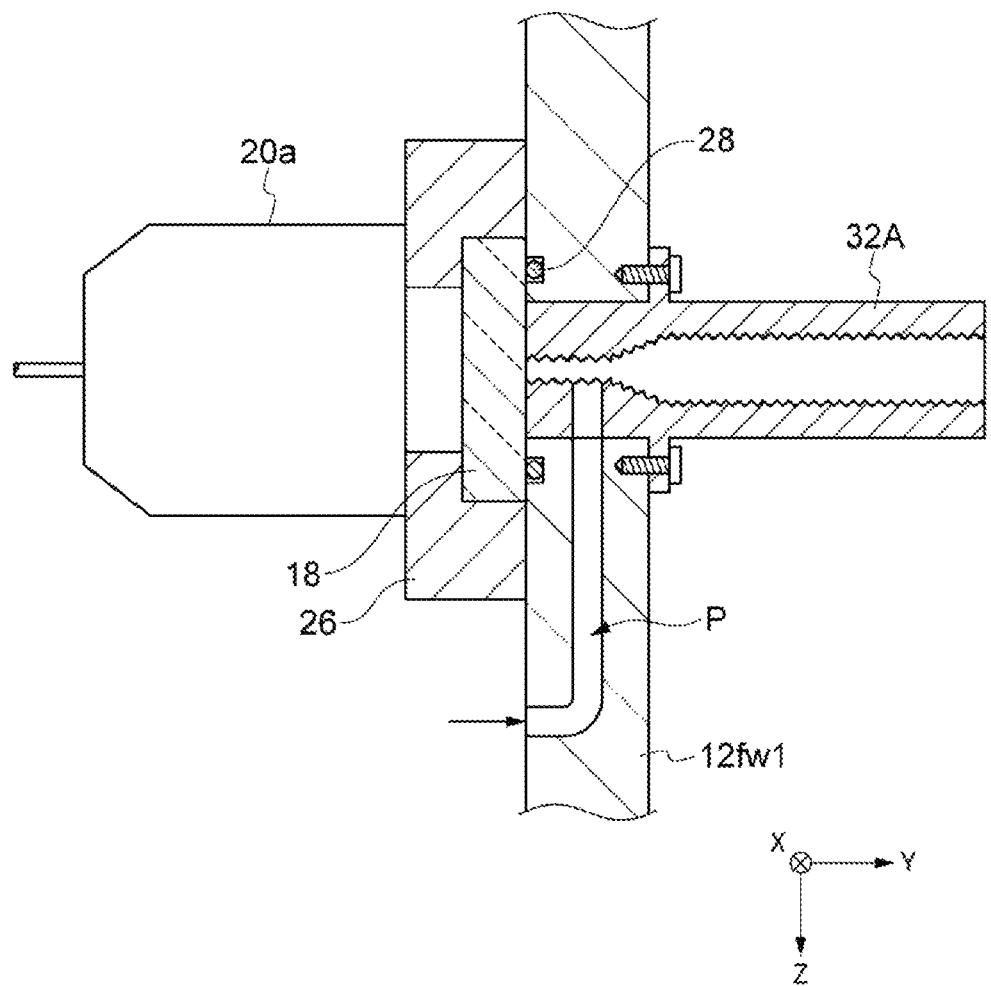
FIG. 6 is an enlarged sectional view of a laser measuring instrument according to another embodiment.

Next, reference is made to FIG. 6. FIG. 6 is a view showing a laser measuring instrument 20 according to a further embodiment. As shown in FIG. 6, the transfer chamber 10 may include a pipe 32A instead of the pipe 32. The pipe 32A differs from the pipe 32 in that the pipe 32A has a first inner diameter in a portion thereof extending in the Y-direction and a second inner diameter smaller than the first inner diameter in another portion thereof extending in the Y-direction. With the pipe 32A, the conductance of the bore can be further reduced in the portion having the second inner diameter. As a result, it is possible to further effectively restrain the gas molecules existing within the transfer space S from flowing into the bore of the pipe 32A.

Figure 7:
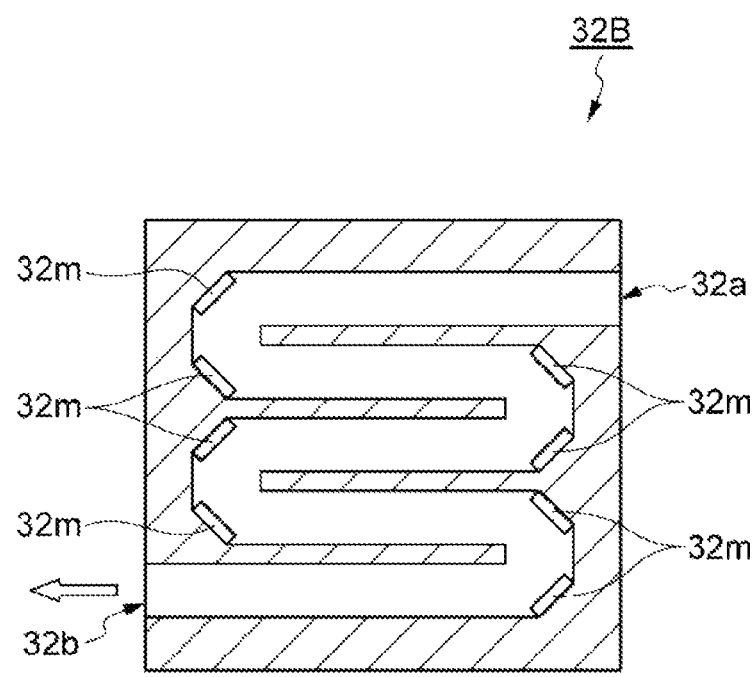
FIG. 7 is a sectional view showing a pipe according to another embodiment.

Subsequently, reference is made to FIG. 7. FIG. 7 is a sectional view showing a pipe according to a still further embodiment. The pipe 32B shown in FIG. 7 has a bore formed along a zigzag route. In order to optically interconnect one end portion 32a of the bore of the pipe 32B existing at the side of the transfer space S and the other end portion 32b of the bore of the pipe 32B existing at the side of the optical window 18, a plurality of mirrors 32m is installed in the bore of the pipe 32B. With this pipe 32B, the distance of the bore from one end portion existing at the side of the transfer space S to the other end portion existing at the side of the optical window 18 becomes longer and the bore extends zigzag. It is therefore possible to reduce the probability that the gas molecules existing within the transfer space S adhere to the optical window 18.

Figure 8:
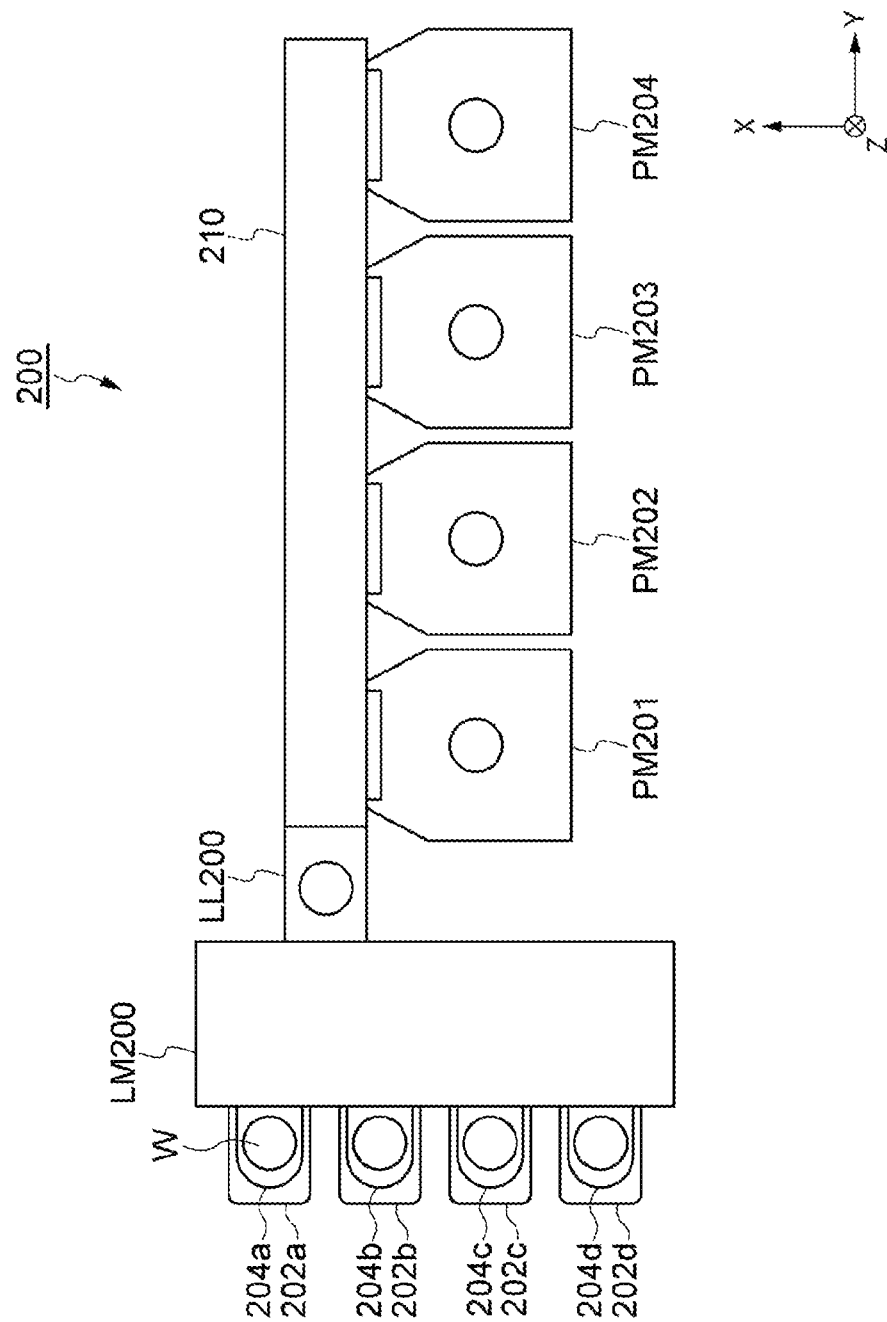
FIG. 8 is a plan view showing a processing system according to another embodiment.

Hereinafter, description will be given on a processing system according to another embodiment. FIG. 8 is a plan view showing a processing system according to another embodiment. The processing system 200 shown in FIG. 8 includes loading tables 202a to 202d, containers 204a to 204d, a loader module LM200, a load lock chamber LL200, a transfer chamber (a vacuum substrate transfer device) 210 and a process modules PM201, PM202, PM203 and PM204.

The loading tables 202a to 202d are arranged in the X-direction along one Y-direction edge portion of the loader module LM200. The containers 204a to 204d are respectively loaded on the loading tables 202a to 202d. Substrates W are accommodated within the containers 204a to 204d.

As with the loader module LM, the loader module LM200 is provided with a transfer unit therein. The transfer unit of the loader module LM200 takes a substrate W out of one of the containers 204a to 204d and transfers the taken-out substrate W.

The transfer chamber 210 is installed at the other Y-direction side of the loader module LM200. The interior of the transfer chamber 210 can be decompressed. The depressurizable load lock chamber LL200 is installed between the loader module LM200 kept under an atmospheric pressure and the transfer chamber 210 which can be used in a decompressed state or a vacuum state. Openable/closable gate valves are respectively installed between the load lock chamber LL200 and the loader module LM200 and between the load lock chamber LL200 and the transfer chamber 210.

The process modules PM201, PM202, PM203 and PM204 are arranged along one edge portion of the transfer chamber 210 extending in the Y-direction. The process modules PM201, PM202, PM203 and PM204 can perform processing of the substrate W such as etching or film forming. The process modules PM201, PM202, PM203 and PM204 are respectively connected to the transfer chamber 210 through gate valves.

In the processing system 200, the substrate W is taken out of one of the containers 204a to 204d by the loader module LM200 and is accommodated within the load lock chamber LL200. The substrate W accommodated within the load lock chamber LL200 is carried in the Y-direction by the transfer chamber 210 and is sent to one of the process modules PM201, PM202, PM203 and PM204. On the other hand, the substrate W processed by one of the process modules PM201, PM202, PM203 and PM204 is returned to the loader module LM200 through the transfer chamber 210 and the load lock chamber LL200.

Figure 9:
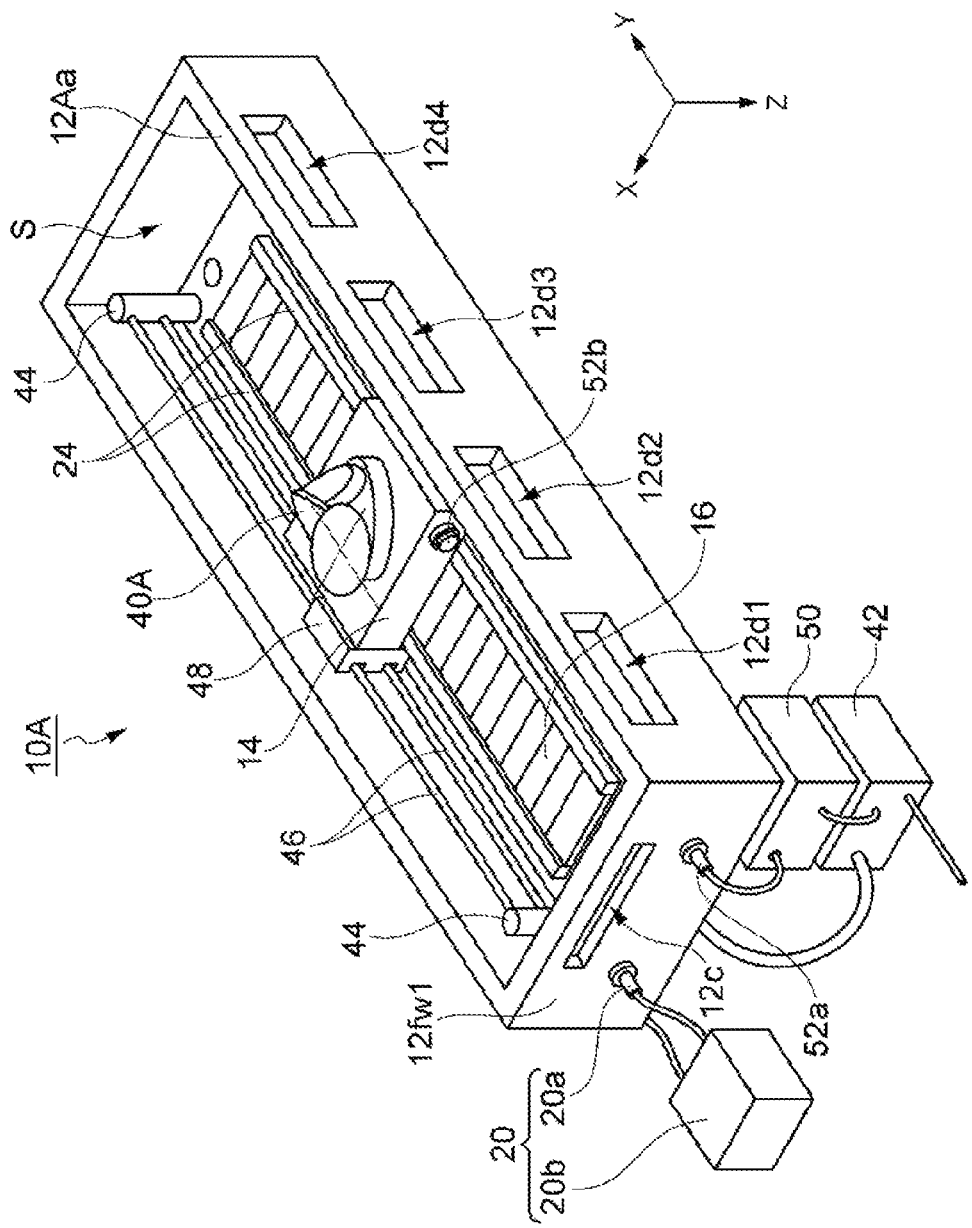
FIG. 9 is a perspective view of a substrate transfer device which can be employed in the processing system shown in FIG. 8, with an upper portion removed so as to show the interior thereof.

Hereinafter, description will be made on a substrate transfer device of one embodiment which can be used as the transfer chamber 210. FIG. 9 is a perspective view of a substrate transfer device which can be employed in the processing system shown in FIG. 8, with an upper portion removed for the illustration of the interior thereof. In the transfer chamber 10A shown in FIG. 9, openings 12d1 to 12d4 are formed in the body portion 12Aa of the chamber wall. The openings 12d1 to 12d4 are openings which lead to the process modules PM201 to PM204.

In the transfer chamber 10A, the transfer robot 40A is installed on the table 14. The transfer robot 40A can take out the substrate W accommodated within the load lock chamber LL200 through the opening 12c formed in the front wall 12fw1 of the body portion 12Aa. Furthermore, the transfer robot 40A can transfer the substrate W to the process modules PM201 to PM204 through the openings 12d1 to 12d4. The laser substrate position detecting device (the laser measuring instrument) of the subject application may be applied to the aforementioned loader module.

Figure 10:
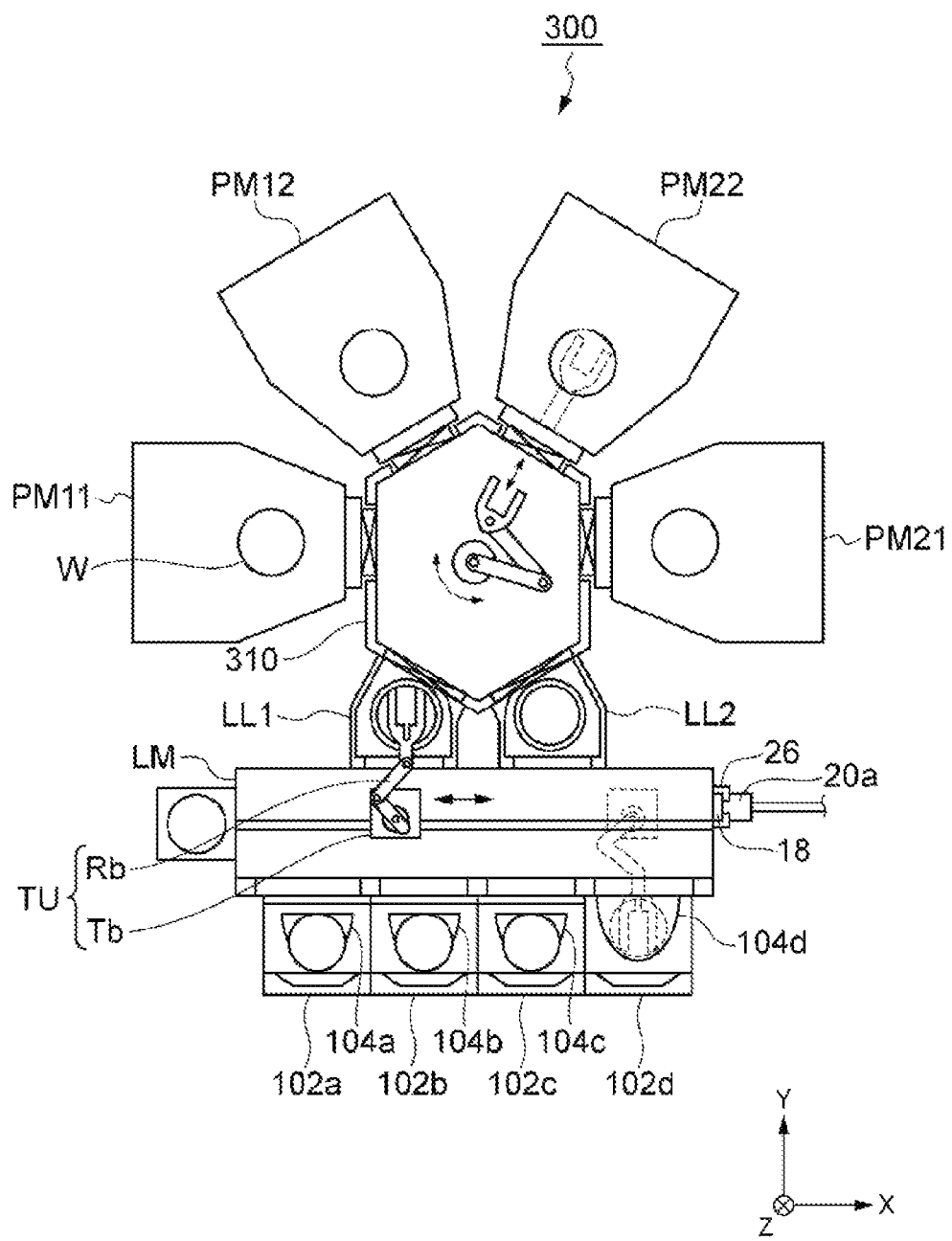
FIG. 10 is a plan view showing a processing system according to another embodiment.

Hereinafter, description will be made on a processing system according to a further embodiment. FIG. 10 is a plan view showing a processing system according to a further embodiment. In the following description, differing points between the processing system 300 shown in FIG. 10 and the processing system 100 shown in FIG. 1 will be described. The processing system 300 includes four process modules PM11, PM12, PM21 and PM22. The processing system 300 further includes a transfer chamber 310 in place of the transfer chamber 110. The transfer chamber 310 does not include a Y-direction moving mechanism but includes a transfer robot which can gain access to the load lock chambers LL1 and LL2 and the process modules PM11, PM12, PM21 and PM22.

In the processing system 300, the loader module LM is configured by the atmosphere substrate transfer device according to one embodiment. As with the processing system 100, the loader module LM of the processing system 300 is provided with a transfer unit TU which includes a table Tb and a transfer robot Rb installed on the table Tb. Just like the transfer unit of the processing system 100, the transfer unit TU can move in the X-direction. In the processing system 300, a laser measuring instrument is attached to the chamber wall defining the transfer space within the loader module LM in order to measure the X-direction position of the table Tb of the transfer unit TU. In FIG. 10, the laser measuring instrument is identical with the one shown in FIG. 4. However, the processing system 300 may be provided with the laser measuring instrument of arbitrary one of the embodiments shown in FIGS. 5 to 7. In the processing system 300, based on the position measured by the laser measuring instrument, an electric signal is supplied from the control unit to the transfer mechanism of the transfer unit TU. This makes it possible to control the position of the transfer unit TU. In this way, the concept of the present disclosure is applicable under an atmospheric pressure environment.

While different embodiments have been described above, the present disclosure is not limited to these embodiments but may be configured in many modified forms. For example, the aforementioned processing systems are described only by way of illustration. The number and positional relationship of the elements such as the loading tables, the containers and the process modules is not limited to the configurations of the aforementioned processing systems.

What is claimed is:

1. A substrate transfer device, comprising:
a chamber wall configured to define a transfer space;
a table accommodated within the transfer space;
a linear motor transfer mechanism configured to move the table within the transfer space;
an optical window installed between the transfer space and a space existing outside the transfer space;
a laser measuring instrument configured to measure a position of the table by irradiating laser light toward the table through the optical window and receiving reflected light coming from the table; and
a pipe configured to optically interconnect the optical window and the transfer space,
wherein the laser measuring instrument is configured to irradiate the laser light through the optical window and a bore of the pipe and to receive the reflected light through the bore of the pipe and the optical window, and
wherein the pipe includes an inner surface defining the bore, at least a portion of the inner surface having corrugations of 0.1 mm to 3 mm.

2. The device of claim 1, wherein the transfer space is a depressurizable transfer space.

3. The device of claim 1, wherein the pipe includes an inner surface defining the bore, the inner surface being a porous surface.

4. The device of claim 1, wherein the bore of the pipe includes a portion having a first inner diameter and a portion having a second inner diameter smaller than the first inner diameter, which portions are arranged along a longitudinal direction of the pipe.

5. The device of claim 1, wherein the bore is defined along a zigzag route, and one or more optical mirrors optically interconnecting one end portion of the bore and the other end portion of the bore are installed in the bore of the pipe.

6. The device of claim 1, further comprising:
a gas supply path configured to supply an inert gas into the bore of the pipe.

* * * * *